(12) United States Patent
Parker et al.

(10) Patent No.: US 11,712,745 B2
(45) Date of Patent: Aug. 1, 2023

(54) SEMICONDUCTOR SUBSTRATE SUPPORT WITH MULTIPLE ELECTRODES AND METHOD FOR MAKING SAME

(71) Applicant: WATLOW ELECTRIC MANUFACTURING COMPANY, St. Louis, MO (US)

(72) Inventors: Michael Parker, Brentwood, CA (US); Alfred Grant Elliot, Palo Alto, CA (US); Brent Donald Alfred Elliot, Cupertino, CA (US); Frank Balma, Los Gatos, CA (US); Richard Erich Schuster, Milpitas, CA (US); Dennis George Rex, Williams, OR (US); Alexander Veytser, Moutain View, CA (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 0 days.

(21) Appl. No.: 17/583,483

(22) Filed: Jan. 25, 2022

(65) Prior Publication Data
US 2022/0143726 A1   May 12, 2022

Related U.S. Application Data

(60) Division of application No. 16/111,148, filed on Aug. 23, 2018, now Pat. No. 11,229,968, which is a continuation-in-part of application No. 15/419,952, filed on Jan. 30, 2017, now Pat. No. 10,646,941, which is a continuation of application No. 13/682,171, filed on Nov. 20, 2012, now Pat. No. 9,556,074.

(Continued)

(51) Int. Cl.
*B23K 1/00* (2006.01)
*B32B 18/00* (2006.01)
(Continued)

(52) U.S. Cl.
CPC .......... *B23K 1/0008* (2013.01); *B23K 1/0016* (2013.01); *B23K 1/19* (2013.01);
(Continued)

(58) Field of Classification Search
CPC ...... B23K 1/0008; B23K 1/0016; B23K 1/19; B23K 1/20; B23K 35/005; B23K 35/286;
(Continued)

(56) References Cited

U.S. PATENT DOCUMENTS 5,452,510 A * 9/1995 Barnes ................ H01L 21/6831
29/458
9,685,356 B2 * 6/2017 Parkhe .............. H01L 21/67109
(Continued)

*Primary Examiner* — Kiley S Stoner
(74) *Attorney, Agent, or Firm* — Burris Law, PLLC

(57) ABSTRACT

A method for manufacturing an electrostatic chuck with multiple chucking electrodes made of ceramic pieces using metallic aluminum as the joining. The aluminum may be placed between two pieces and the assembly may be heated in the range of 770 C to 1200 C. The joining atmosphere may be non-oxygenated. After joining the exclusions in the electrode pattern may be machined by also machining through one of the plate layers. The machined exclusion slots may then be filled with epoxy or other material. An electrostatic chuck or other structure manufactured according to such methods.

14 Claims, 9 Drawing Sheets

Related U.S. Application Data

(60) Provisional application No. 62/550,559, filed on Aug. 25, 2017, provisional application No. 61/565,396, filed on Nov. 30, 2011, provisional application No. 61/592,587, filed on Jan. 30, 2012, provisional application No. 61/605,707, filed on Mar. 1, 2012, provisional application No. 61/658,896, filed on Jun. 12, 2012, provisional application No. 61/707,865, filed on Sep. 28, 2012.

(51) Int. Cl.

| | | |
|---|---|---|
| B32B 9/00 | (2006.01) | |
| B32B 15/20 | (2006.01) | |
| C04B 37/00 | (2006.01) | |
| B23K 1/19 | (2006.01) | |
| B23K 1/20 | (2006.01) | |
| B23K 35/28 | (2006.01) | |
| B23K 35/00 | (2006.01) | |
| C04B 35/645 | (2006.01) | |
| B32B 9/04 | (2006.01) | |
| F16B 9/00 | (2006.01) | |
| B32B 3/30 | (2006.01) | |
| B32B 7/14 | (2006.01) | |
| H01L 21/67 | (2006.01) | |
| H01L 21/683 | (2006.01) | |
| H05B 1/00 | (2006.01) | |
| H01L 21/687 | (2006.01) | |
| B23K 103/10 | (2006.01) | |

(52) U.S. Cl.
CPC ............ *B23K 1/20* (2013.01); *B23K 35/005* (2013.01); *B23K 35/286* (2013.01); *B32B 3/30* (2013.01); *B32B 7/14* (2013.01); *B32B 9/005* (2013.01); *B32B 9/04* (2013.01); *B32B 9/041* (2013.01); *B32B 15/20* (2013.01); *B32B 18/00* (2013.01); *C04B 35/645* (2013.01); *C04B 37/001* (2013.01); *C04B 37/006* (2013.01); *F16B 9/00* (2013.01); *H01L 21/67103* (2013.01); *H01L 21/6831* (2013.01); *H01L 21/6833* (2013.01); *H01L 21/68757* (2013.01); *H01L 21/68785* (2013.01); *H05B 1/00* (2013.01); *B23K 2103/10* (2018.08); *C04B 2235/6562* (2013.01); *C04B 2235/6565* (2013.01); *C04B 2235/6567* (2013.01); *C04B 2235/6581* (2013.01); *C04B 2235/6582* (2013.01); *C04B 2235/945* (2013.01); *C04B 2237/121* (2013.01); *C04B 2237/122* (2013.01); *C04B 2237/126* (2013.01); *C04B 2237/127* (2013.01); *C04B 2237/34* (2013.01); *C04B 2237/343* (2013.01); *C04B 2237/348* (2013.01); *C04B 2237/36* (2013.01); *C04B 2237/365* (2013.01); *C04B 2237/366* (2013.01); *C04B 2237/368* (2013.01); *C04B 2237/592* (2013.01); *C04B 2237/61* (2013.01); *C04B 2237/64* (2013.01); *C04B 2237/66* (2013.01); *C04B 2237/68* (2013.01); *C04B 2237/704* (2013.01); *C04B 2237/708* (2013.01); *C04B 2237/72* (2013.01); *C04B 2237/76* (2013.01); *C04B 2237/765* (2013.01); *C04B 2237/80* (2013.01); *C04B 2237/84* (2013.01); *Y10T 403/46* (2015.01); *Y10T 428/31504* (2015.04); *Y10T 428/31678* (2015.04)

(58) Field of Classification Search
CPC ............ B23K 2103/10; B23K 2103/52; B23K 1/008; B23K 1/00–206; B23K 37/0461; B32B 3/30; B32B 7/14; B32B 9/005; B32B 9/04; B32B 9/041; B32B 15/20; B32B 18/00; C04B 35/645; C04B 37/001; C04B 37/006; C04B 2235/6562; C04B 2235/6565; C04B 2235/6567; C04B 2235/6581; C04B 2235/6582; C04B 2235/945; C04B 2237/121; C04B 2237/122; C04B 2237/126; C04B 2237/127; C04B 2237/34; C04B 2237/343; C04B 2237/348; C04B 2237/36; C04B 2237/365; C04B 2237/366; C04B 2237/368; C04B 2237/592; C04B 2237/61; C04B 2237/64; C04B 2237/66; C04B 2237/68; C04B 2237/704; C04B 2237/708; C04B 2237/72; C04B 2237/76; C04B 2237/765; C04B 2237/80; C04B 2237/84; C04B 2237/55; C04B 2237/62; F16B 9/00; F16B 11/006; F16B 2001/0064; F16B 2001/0085; H01L 21/67103; H01L 21/6831; H01L 21/6833; H01L 21/68757; H01L 21/68785; H05B 1/00; Y10T 403/46; Y10T 428/31504; Y10T 428/31678
USPC .................................. 228/121, 164, 172, 174
See application file for complete search history.

(56) References Cited

U.S. PATENT DOCUMENTS

| | | | |
|---|---|---|---|
| 10,008,399 B2* | 6/2018 | Parkhe | H01L 21/67103 |
| 2007/0079936 A1* | 4/2007 | Li | H01P 1/08 |
| | | | 156/60 |
| 2009/0173448 A1* | 7/2009 | Fujii | H01L 21/6833 |
| | | | 156/379.6 |
| 2009/0235866 A1* | 9/2009 | Kataigi | H01L 21/6875 |
| | | | 118/725 |
| 2012/0287552 A1* | 11/2012 | Shiraiwa | H01L 21/67109 |
| | | | 361/234 |
| 2013/0181038 A1* | 7/2013 | Elliot | B32B 18/00 |
| | | | 228/221 |
| 2014/0063682 A1* | 3/2014 | Anada | H01L 21/68757 |
| | | | 361/234 |
| 2014/0154465 A1* | 6/2014 | Sun | H01L 21/6831 |
| | | | 156/89.12 |
| 2014/0159325 A1* | 6/2014 | Parkhe | H01L 21/67109 |
| | | | 156/154 |
| 2014/0203526 A1* | 7/2014 | Banda | B28D 5/0082 |
| | | | 279/128 |
| 2017/0069520 A1* | 3/2017 | Unno | H01L 21/6833 |
| 2017/0303338 A1* | 10/2017 | Parkhe | H01L 21/6833 |
| 2017/0323819 A1* | 11/2017 | Kosakai | H01L 21/6831 |
| 2018/0068883 A1* | 3/2018 | Ito | C09J 183/04 |
| 2019/0013231 A1* | 1/2019 | Yamaguchi | H01L 21/6835 |
| 2019/0276366 A1* | 9/2019 | Sun | C04B 35/505 |
| 2019/0291199 A1* | 9/2019 | Elliot | B23K 35/286 |
| 2019/0311934 A1* | 10/2019 | Tsuchida | C04B 37/021 |
| 2020/0090959 A1* | 3/2020 | Takebayashi | H01L 21/68757 |
| 2020/0206835 A1* | 7/2020 | Parker | H01L 21/68757 |
| 2020/0223013 A1* | 7/2020 | Gratrix | B23K 26/10 |
| 2021/0154776 A1* | 5/2021 | Elliot | C04B 37/006 |
| 2021/0183679 A1* | 6/2021 | Kuribayashi | H01L 21/68785 |
| 2022/0230905 A1* | 7/2022 | Ishikawa | B32B 7/12 |

* cited by examiner

SEMICONDUCTOR SUBSTRATE SUPPORT WITH MULTIPLE ELECTRODES AND METHOD FOR MAKING SAME

CROSS-REFERENCE TO RELATED APPLICATIONS

This application is a divisional of U.S. patent application Ser. No. 16/111,148 filed Aug. 23, 2018, which is a continuation-in-part of U.S. patent application Ser. No. 15/419,952 filed Jan. 30, 2017, now U.S. Pat. No. 10,646,941, which is a continuation of U.S. patent application Ser. No. 13/682,171 filed Nov. 20, 2012, now U.S. Pat. No. 9,556,074, which claims priority to provisional applications U.S. Provisional Patent Application No. 61/565,396, filed Nov. 30, 2011, and U.S. Provisional Patent Application No. 61/592,587, filed Jan. 30, 2012, and U.S. Provisional Patent Application No. 61/605,707, filed Mar. 1, 2012, and U.S. Provisional Patent Application No. 61/658,896, filed Jun. 12, 2012, and U.S. Provisional Patent Application No. 61/707,865, filed Sep. 28, 2012. This application claims priority to U.S. Provisional Patent Application No. 62/550,559 filed Aug. 25, 2017, which is hereby incorporated by reference in its entirety.

BACKGROUND

Semiconductor support structures with multiple chucking electrodes may be used in support of semiconductor processing and in other industrial applications. Prior methods for making such pieces are costly and time intensive.

SUMMARY OF THE INVENTION

A method for manufacturing an electrostatic chuck with multiple chucking electrodes made of ceramic pieces using metallic aluminum as the joining. The aluminum may be placed between two pieces and the assembly may be heated in the range of 770 C to 1200 C. The joining atmosphere may be non-oxygenated. After joining the exclusions in the electrode pattern may be machined by also machining through one of the plate layers. The machined exclusion slots may then be filled with epoxy or other material. An electrostatic chuck or other structure manufactured according to such methods.

DETAILED DESCRIPTION

A method for manufacture of an electrostatic chuck with multiple chucking electrodes begins with the joining of two plates. In some embodiments, the two plates are circular plates and are of a ceramic. In some embodiments, the two plates are circular plates and are of a ceramic known to not be susceptible to diffusion by aluminum. In some aspects, the ceramic is alumina, aluminum nitride, sapphire, beryllium oxide, or zirconia. In some aspects the plates are of quartz.

Figure 1:
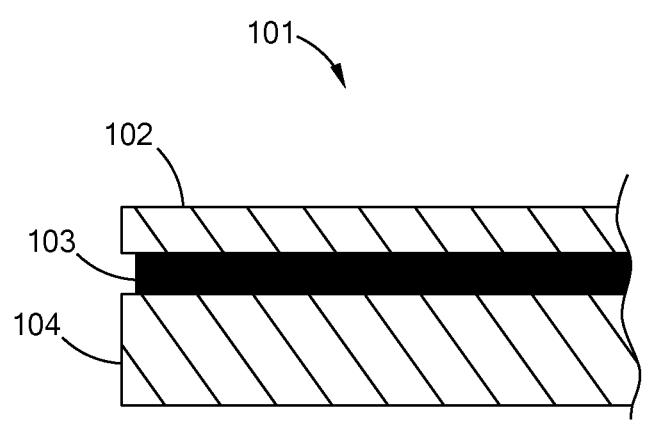
FIG. 1 is cross-sectional view of two joined plates.

FIG. 1 is a partial cross-sectional view of an assembly 101 according to some embodiments of the present invention. A ceramic top layer 102 is joined to a ceramic bottom layer 104 with a joining layer 103. In some aspects, the joining layer 103 is used to join the top layer 102 to the bottom layer 104 and then also to function as one or more chucking electrodes. Although the joining layer 103 is illustrated in FIG. 1 as going nearly to the edge of the top ceramic layer 102, in some aspects there may be an electrical decoupling of the outer circumferential portion of the joining layer. In some aspects, the ceramic top layer 102 is of alumina, aluminum nitride, sapphire, beryllium oxide, or zirconia. In some aspects, the ceramic bottom layer 104 is of alumina, aluminum nitride, sapphire, beryllium oxide, or zirconia. In some aspects, the joining layer is aluminum. In some aspects, the joining layer is a metal layer of aluminum of greater than 89% by weight. In some aspects, the joining layer is a metal layer of aluminum of greater than 99% by weight. In some aspects, the joining layer is a metal layer of aluminum of greater than 99.99% by weight.

In an exemplary embodiment, two ceramic plated discs are alumina and are 0.125 inches thick each. Each alumina disc is sputtered with 12.5 microns of aluminum. The plates are then brazed according to processes described below. In an exemplary embodiment, the plates are pressed together with approximately 2 psi of contact pressure and brazed at 850 C under vacuum with a pressure lower than 1×10 E-4 Torr. The brazed assembly may be seen in partial cross-section in FIG. 1 (although both plates may be of the same thickness).

In some embodiments, both the ceramic top layer and the ceramic bottom layer are pre-metallized with a layer of metal. In some aspects, the metal is high purity aluminum. In some aspects, each layer is pre-metallized with an aluminum layer with a thickness in the range of 10-15 microns. In some aspects, each layer is pre-metallized with a sputtered aluminum layer with a thickness in the range of 10-20 microns. In some aspects, each layer is pre-metallized with an aluminum layer with a thickness in the range of 12.5-15 microns. In some aspects, each layer is pre-metallized with an aluminum layer with a thickness of greater than 10 microns. The metal layers on the ceramic top layer and the ceramic bottom layer may form the entirety of the metal which forms the joining layer.

In some embodiments, only one of the ceramic top layer and the ceramic bottom layer is pre-metallized with a layer of metal. In some aspects, the metal is high purity aluminum. In some aspects, one of the layers is pre-metallized with an aluminum layer with a thickness in the range of 20-30 microns. In some aspects, one of the layers is pre-metallized with an aluminum layer with a thickness of greater than 20 microns. In some aspects, one of the layers is pre-metallized with an aluminum layer with a thickness in the range of 20-50 microns. The metal layer on either the ceramic top layer and the ceramic bottom layer may form the entirety of the metal which forms the joining layer.

After brazing, the two circular plates will have a circular disc of aluminum between them which join them with a hermetic seal. An exclusion pattern may be machined into the aluminum layer by machining through one of the plates and then through the Al layer. In some aspects, the machining is done using ultrasonic milling and continues into the other plate approximately 0.001 inches. In some aspects, the machining is done through the bottom ceramic layer, and then also through the joining layer.

Figure 2:
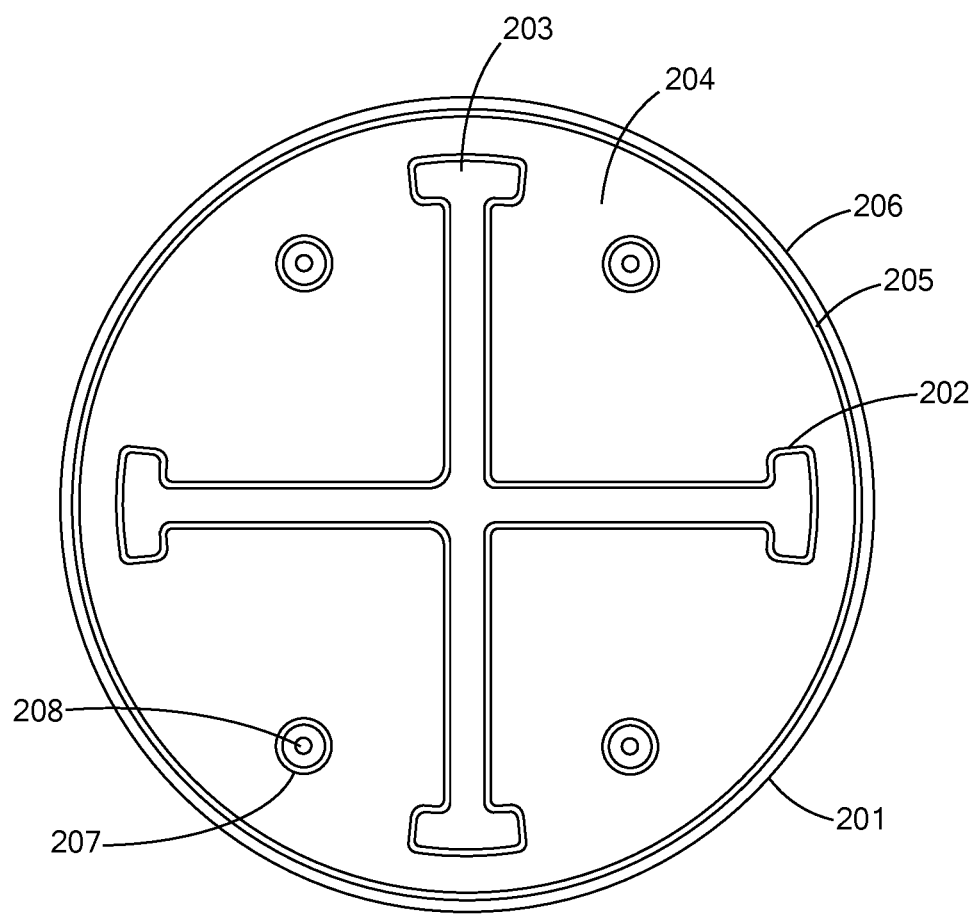
FIG. 2 is a view of a grind pattern according to some embodiments of the present invention.
Figure 3:
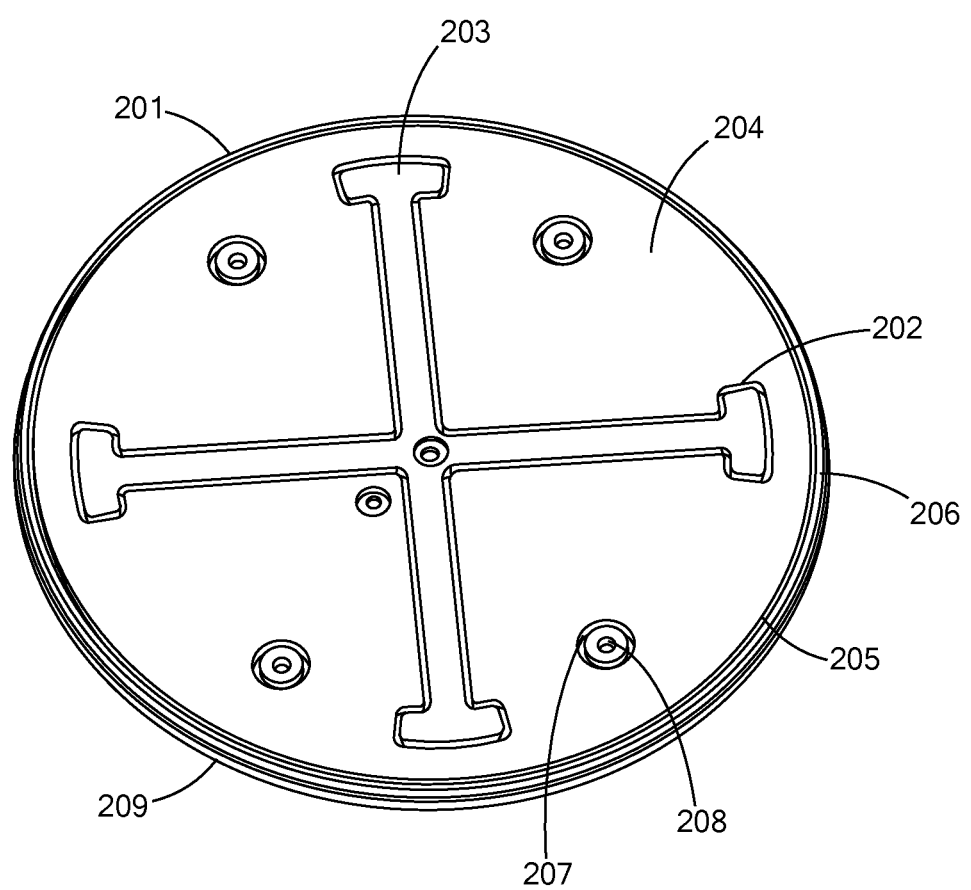
FIG. 3 is a perspective view of a grind pattern according to some embodiments of the present invention.
Figure 4:
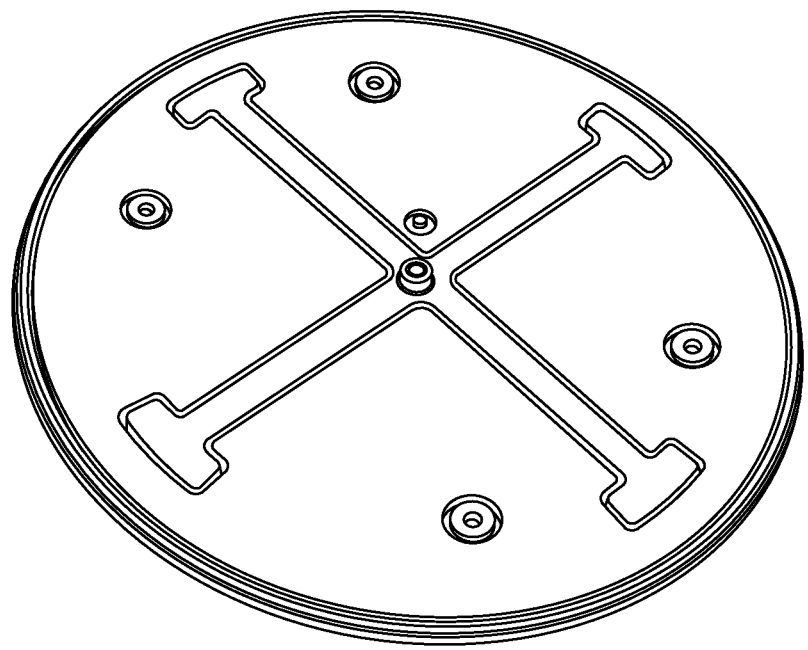
FIG. 4 is a photograph of a plate assembly with a grind pattern according to some embodiments of the present invention.

FIGS. 2, 3, and 4 illustrate the exclusion pattern and the machining done through the plate, the aluminum layer, and also partially into the second plate for a bipolar electrostatic chuck according to some embodiments of the present invention. FIGS. 2 and 3 illustrate the machining done through the ceramic bottom layer 201. At this stage of process of making the completed assembly, the exclusion pattern has been completed, but the filling of the exclusions has not yet occurred, nor has the final machining. An electrode pattern splitting groove 202 splits the electrode into an interior electrode area 203, which is cross-shaped in this exemplary embodiment, and an exterior electrode area 204. The electrode pattern splitting groove 202 is machined through the ceramic bottom plate 201 and through the joining layer and just into the ceramic top layer 209. An outer groove 205 decouples an outer periphery portion 206 from the exterior electrode area 204. The outer groove 205 also then electrically decouples an outer annular ring of the joining layer from the electrode portion of the joining layer. Also seen are lift pin grooves 207 which electrically decouple the electrode from the joining layer which resides just around the lift pin through holes 208. FIG. 4 is a photograph of an actual assembly as illustrated in FIGS. 3 and 4. In some aspects, the grooves may be as narrow as 0.063 inches wide. The groove should be wide enough such that the dielectric barrier created by the dielectric material in the groove is sufficient for the target application. Although illustrated as a two electrode device in this exemplary embodiment, in some aspects there may be more electrode portions split off. In some aspects, there may be a single electrode portion.

The exclusion pattern in the aluminum layer is mirrored with a void in the plate through which the machining was carried out. The void is then filled with a filler, such as a high dielectric effect epoxy. The filler may be a high dielectric strength high thermal conductivity elastomer. In some aspects, the filler may be magnesium oxide and then covered with glass such as fiberglass. In some aspects, the voids are filled with solid pieces of dielectric material, which may be bonded in with a high dielectric effect epoxy. In some aspects, the voids are filled with solid pieces of the same ceramic as the plate layers, which may be bonded in with a high dielectric effect epoxy.

Figure 5:
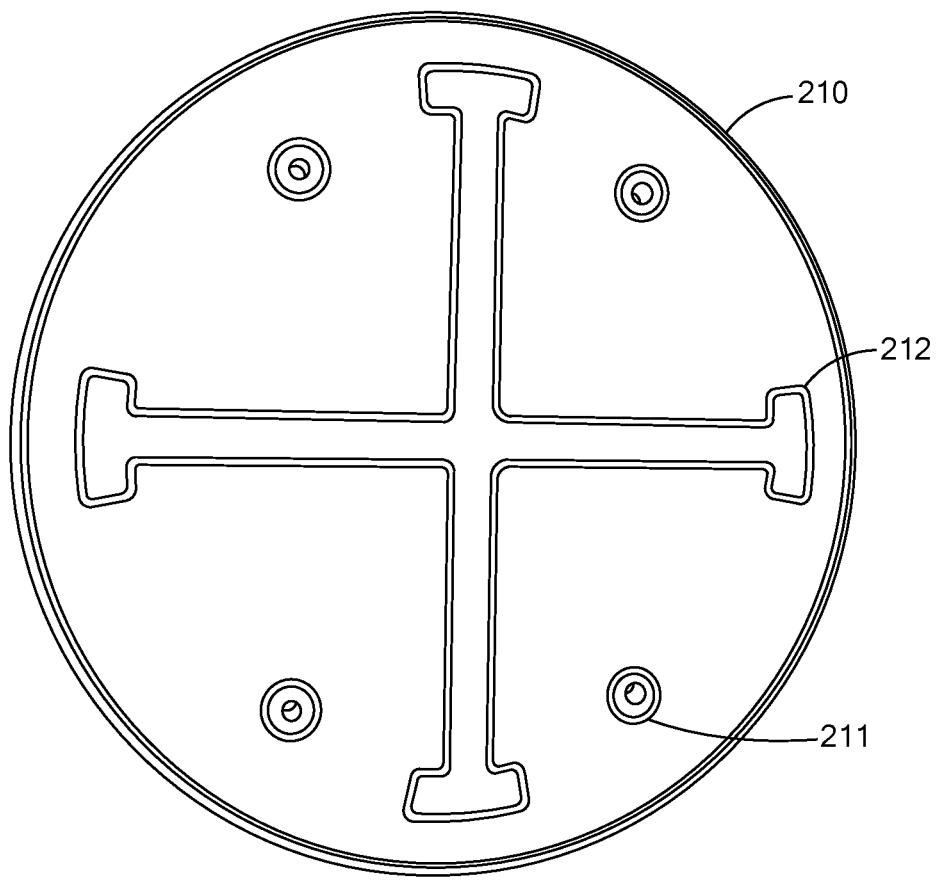
FIG. 5 is a photograph of a plate assembly with a filled grind pattern according to some embodiments of the present invention.

FIG. 5 is a photograph of the assembly at a later stage of completion according to some embodiments of the present invention. The electrode splitting groove 202 has been filled 212 with a high dielectric effect epoxy. The outer groove 205 has been filled 210 with a high dielectric effect epoxy. The lift pin grooves 207 has been filled 211 with a high dielectric effect epoxy. In some aspects, the grooves may be filled with solid pieces of dielectric material, which may be bonded in with a high dielectric effect epoxy.

The back filled plate may then be planarized so that the surface through which the filler was placed can be made flat. After the filling of the voids, the plate through which the machining was not done, which may become a top plate, may be machined down to a thinner thickness to complete the ceramic plate assembly. For example, the top plate may be machined down to the range of 0.010 to 0.012 inches, or other thinner thickness. In some aspects, the top plate thickness may be in the range of 0.005 to 0.015 inches. In some aspects, the top plate thickness may be in the range of 0.005 to 0.010 inches. In some aspects, the top plate may be thinned down to a thickness of 0.006 inches. With the placement of the filler material underneath the top layer in the exclusion zones of the electrode pattern, there is support for the top layer as the machining thins down the top plate. Without such support, machining down to such a thin top plate may result in cracking or other damage to the top plate due to deflection of the plate during machining.

Figure 6A:
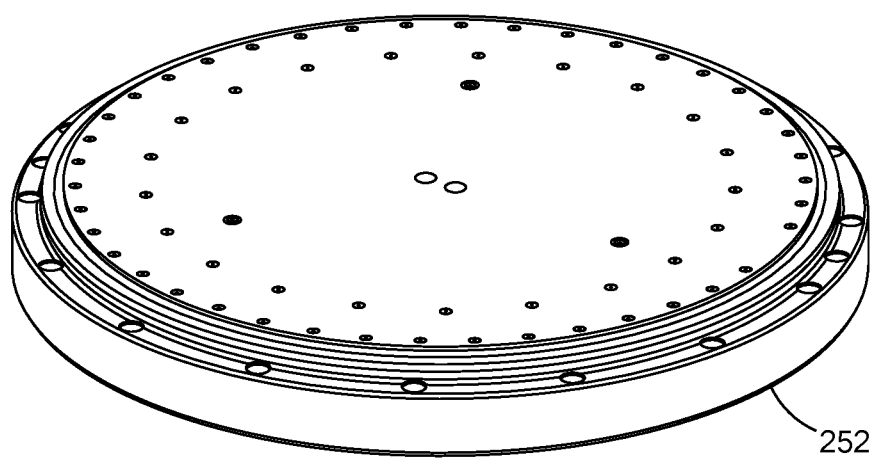
FIG. 6A is a view of a chuck according to some embodiments of the present invention.
Figure 6B:
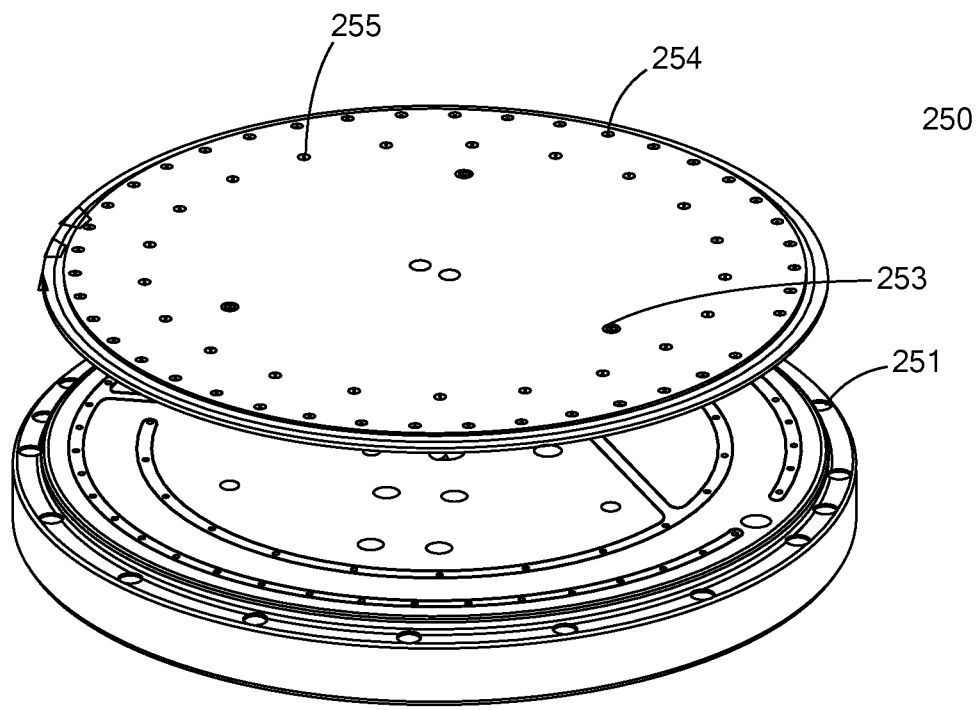
FIG. 6B is an exploded view of a chuck according to some embodiments of the present invention.

FIGS. 6A and 6B illustrate a view and an exploded view, respectively, of an electrostatic chuck 252 according to some embodiments of the present invention. A ceramic plate assembly 250 comprising a ceramic top layer, a metal joining layer, and a ceramic bottom layer, is affixed to a base 251. The base 251 may be of metal, which may be aluminum. The base 251 may include gas plenums which route gas into gas holes 254, 255 in the ceramic plate assembly 250. The ceramic plate assembly 250 may be affixed to the base 251 with an appropriate joining material, which may be a sheet adhesive. The ceramic plate assembly 2250 may include lift pin holes 253. In some embodiments, the ceramic top layer will be so thin that the exclusion pattern in the metal joining layer and the metal joining layer may be visible through the top surface.

The completed electrostatic chuck may be able to withstand 10,000V without cross talk. An exemplary embodiment of the electrostatic chuck is seen is seen FIG. 6.

The braze material may be in the form of a sheet, a powder, a thin film, or be of any other form factor suitable for the brazing processes described herein. For example, the brazing layer may be a sheet having a thickness ranging from 0.00019 inches to 0.011 inches or more. In some embodiments, the braze material may be a sheet having a thickness of approximately 0.0012 inches. In some embodiments, the braze material may be a sheet having a thickness of approximately 0.006 inches. Typically, alloying constituents (such as magnesium, for example) in aluminum are formed as precipitates in between the grain boundaries of the aluminum. While they can reduce the oxidation resistance of the aluminum bonding layer, typically these precipitates do not form contiguous pathways through the aluminum, and thereby do not allow penetration of the oxidizing agents through the full aluminum layer, and thus leaving intact the self-limiting oxide-layer characteristic of aluminum which provides its corrosion resistance. In the embodiments of using an aluminum alloy which contains constituents which can form precipitates, process parameters, including cooling protocols, would be adapted to minimize the precipitates in the grain boundary. For example, in one embodiment, the braze material may be aluminum having a purity of at least 99.5%. In some embodiments, a commercially available aluminum foil, which may have a purity of greater than 92%, may be used. In some embodiments, alloys are used. These alloys may include Al-5 w % Zr, Al-5 w % Ti, commercial alloys #7005, #5083, and #7075. These alloys may be used with a joining temperature of 1100 C in some embodiments. These alloys may be used with a temperature between 800 C and 1200 C in some embodiments. These alloys may be used with a lower or higher temperature in some embodiments. In some aspects, the aluminum joining layer forms from pre-deposited layers on one or more of the ceramic plate layers, as described above.

The non-susceptibility of AlN to diffusion with aluminum under the conditions of processes according to embodiments of the present invention results in the preservation of the material properties, and the material identity, of the ceramic after the brazing step in the manufacturing of the plate and shaft assembly.

In some embodiments, the joining process is performed in a process chamber adapted to provide very low pressures. Joining processes according to embodiments of the present invention may require an absence of oxygen in order to achieve a hermetically sealed joint. In some embodiments, the process is performed at a pressure lower than $1\times10$ E-4 Torr. In some embodiments, the process is performed at a pressure lower than $1\times10$ E-5 Torr. In some embodiments, further oxygen removal is achieved with the placement of zirconium or titanium in the process chamber. For example, a zirconium inner chamber may be placed around the pieces which are to be joined.

In some embodiments, atmospheres other than vacuum may be used to achieve a hermetic seal. In some embodiments, argon (Ar) atmosphere may be used to achieve hermetic joints. In some embodiments, other noble gasses are used to achieve hermetic joints. In some embodiments, hydrogen (H2) atmosphere may be used to achieve hermetic joints.

The wetting and flow of the brazing layer may be sensitive to a variety of factors. The factors of concern include the braze material composition, the ceramic composition, the chemical makeup of the atmosphere in the process chamber, especially the level of oxygen in the chamber during the joining process, the temperature, the time at temperature, the thickness of the braze material, the surface characteristics of the material to be joined, the geometry of the pieces to be joined, the physical pressure applied across the joint during the joining process, and/or the joint gap maintained during the joining process.

An example of a brazing method for joining together first and second ceramic objects may include the steps of bringing the first and second objects together with a brazing layer selected from the group consisting of aluminum and an aluminum alloy disposed between the first and second ceramic objects, heating the brazing layer to a temperature of at least 800 C, and cooling the brazing layer to a temperature below its melting point so that the brazing layer hardens and creates a hermetic seal so as to join the first member to the second member. Various geometries of braze joints may be implemented according to methods described herein. In some aspects, the joining layer is of aluminum of greater than 99% by weight aluminum, and the joining temperature is a temperature of at least 770 C. In some aspects, the joining layer is of aluminum of greater than 99% by weight aluminum, and the joining temperature is a temperature in the range of 770 C to 1200 C.

Figure 7:
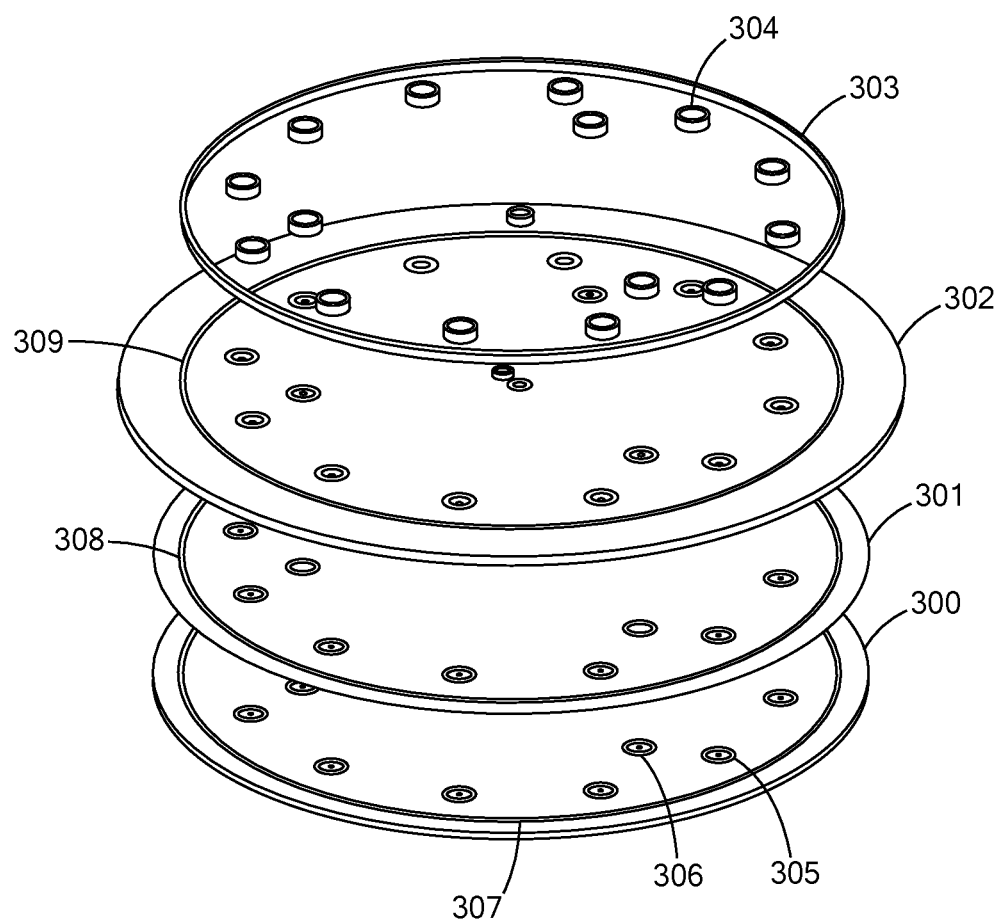
FIG. 7 is an exploded view of a chuck according to some embodiments of the present invention.

FIG. 7 illustrates an exploded view of a monopolar electrostatic chuck plate assembly according to some embodiments of the present invention. In this illustrative view, what will become the top layer of a chuck is seen on the bottom. The ceramic top layer 300 is separated from the ceramic bottom layer 302 by the joining layer 301. The joining layer 301 joins the top and bottom ceramic layers and also functions as an electrode, or as multiple electrodes if split, after the manufacturing process is complete. The ceramic bottom layer 302 is seen with an outer groove 309, which goes through the ceramic bottom layer 302. The electrode 301 is seen with an outer groove 308, which goes through the electrode layer 301. The ceramic top layer 300 is seen with an outer groove 307, which enters only partially to a shallow depth in the ceramic top layer 300. The other illustrated grooves, for example the ring grooves 305 around the cooling gas holes, and the lift pin grooves 306 around the lift pin holes, similarly go through the ceramic bottom layer, the electrode layer, and on partially into the ceramic top layer. Dielectric material portions are placed into the various grooves described above. The outer ring dielectric portion 303 will reside in the outer ring groove within the ceramic bottom layer, the electrode layer, and a portion of the ceramic top layer. The ring dielectric portions 304 will reside in the lift pin and cooling gas ring grooves within the ceramic bottom layer, the electrode layer, and a portion of the ceramic top layer. In some aspects, the ceramic bottom layer is a ceramic from the group of alumina, aluminum nitride, berrylia, zirconia, and sapphire. In some aspects, the ceramic top layer is a ceramic from the group of alumina, aluminum nitride, berrylia, zirconia, and sapphire. In some aspects, the joining layer is of aluminum as described herein.

Figure 8A:
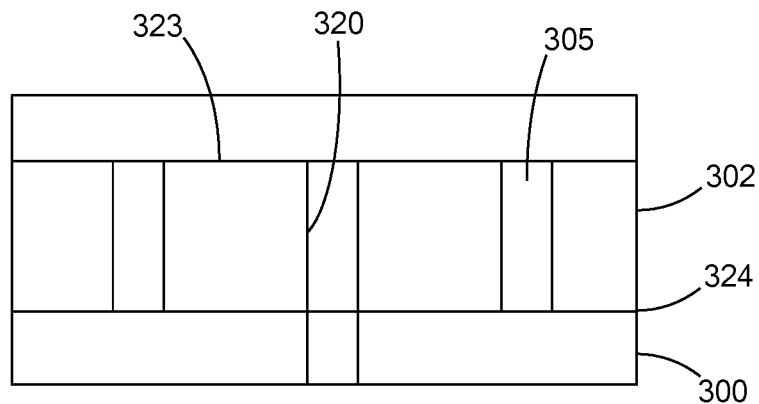
FIG. 8A is a cross-sectional view of a lift pin hole in a chuck according to some embodiments of the present invention.
Figure 8B:
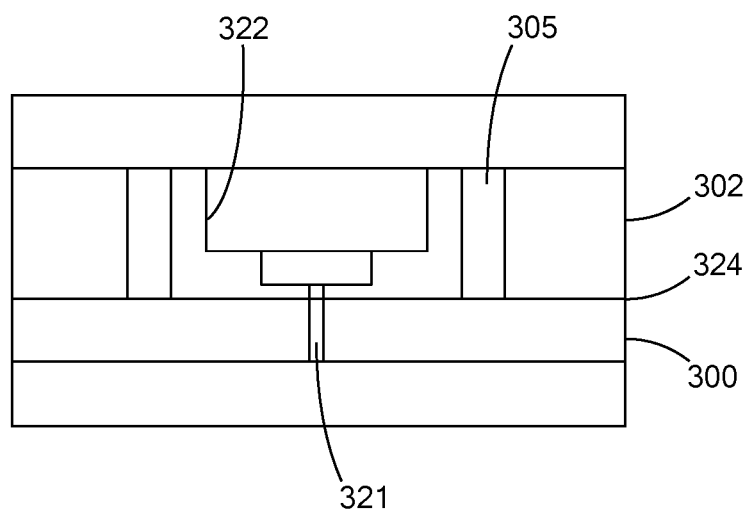
FIG. 8B is a cross-sectional view of a cooling gas hole in a chuck according to some embodiments of the present invention.
Figure 9:
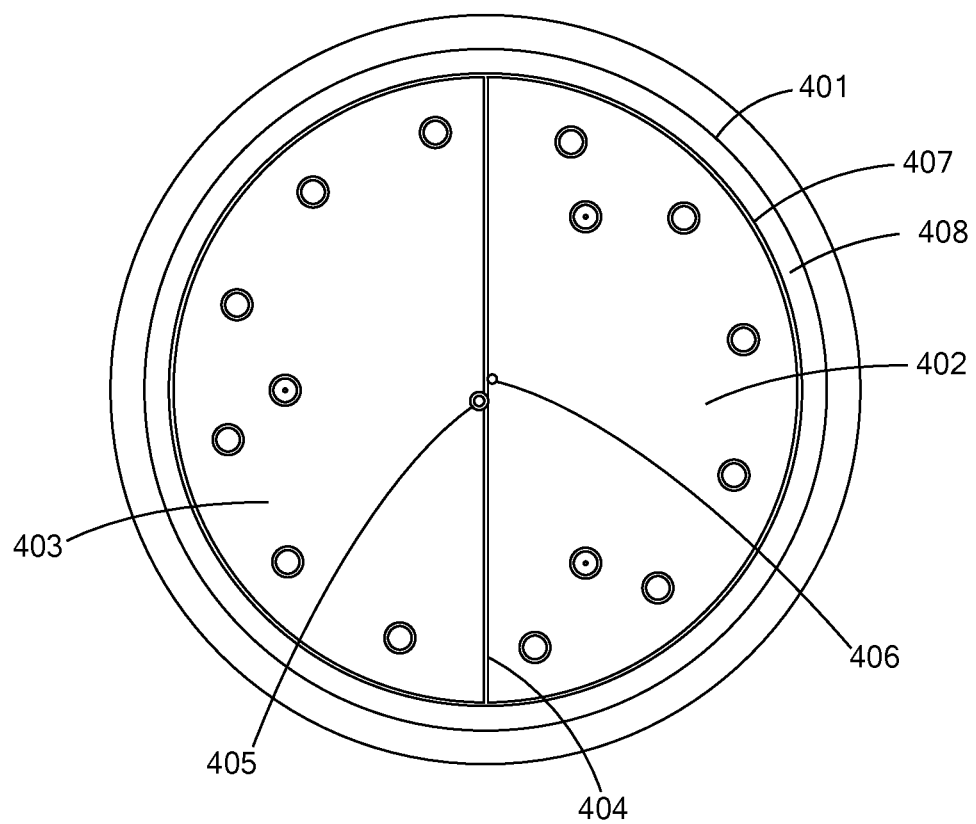
FIG. 9 is a view of a two electrode plate assembly according to some embodiments of the present invention.

FIGS. 8A and 8B illustrate cross-section views of a lift pin hole and a cooling gas hole, respectively, according to some embodiments of the present invention. FIG. 8A illustrates a partial cross-section in the area of a lift pin hole according to some embodiments of the present invention. Lift pin ring grooves 306 have been machined through the ceramic bottom layer 302 and through the electrode layer 324, and just partially into the ceramic top layer 300. The lift pin through hole 320 is through the ceramic bottom layer, the metal joining electrode layer, and the ceramic top layer. The ceramic bottom layer remains 323 outside the lift pin through hole 320 and within the lift pin ring groove 306. FIG. 8B illustrates a partial cross-section in the area of a cooling gas hole 321 according to some embodiments of the present invention. Cooling gas ring grooves 305 have been machined through the ceramic bottom layer 302 and through the electrode layer 324, and just partially into the ceramic top layer 300. The cooling gas through hole 321 is through the ceramic bottom layer, the metal joining electrode layer, and the ceramic top layer. The ceramic bottom layer is shaped 322 to allow for cooling gas access through the cooling gas hole 321 through the layers including the ceramic top layer.

FIG. 10 illustrates a two zone electrostatic chuck assembly according to some embodiments of the present invention. This illustrative figure shows aspects of the metal layer 401, although one could not see the layer. A first electrode portion 403 is seen split from a second electrode portion 402 by a splitting area 404. An outer ring groove 407 isolates an outer ring portion 408 from the electrode portions 402, 403. Electrical connections to the electrodes may be made at attachment areas 405, 406.

A joining process according to some embodiments of the present invention may comprise some or all of the following steps. Two or more ceramic pieces are selected for joining. In some embodiments, a plurality of pieces may be joined using a plurality of joining layers in the same set of process steps, but for the sake of clarity of discussion two ceramic pieces joined with a single joining layer will be discussed herein. The ceramic pieces may be of alumina. The ceramic pieces may be of aluminum nitride. The ceramic pieces may be of mono-crystalline or poly-crystalline aluminum nitride. The ceramic pieces may be of alumina, aluminum nitride, beryllia, zirconia, or sapphire. Portions of each piece have been identified as the area of each piece which will be joined to the other. In an illustrative example, a ceramic top layer is to be joined to a ceramic bottom layer. The joining material may be a brazing layer comprising aluminum of >99% aluminum content. In some embodiments, the specific surface areas which will be joined will undergo a pre-metallization step. This pre-metallization step may be achieved in a variety of ways. PVD, CVD, electro-plating, plasma spray, or other methods may be used to apply the pre-metallization.

Prior to joining, the two pieces may be fixtured relative to each other to maintain some positional control while in the process chamber. The fixturing may also aid in the application of an externally applied load to create contact pressure between the two pieces, and across the joint, during the application of temperature. A weight may be placed on top of the fixture pieces such that contact pressure in applied across the joint. The weight may be proportioned to the area of the brazing layer. In some embodiments, the contact pressure applied across the joint may be in the range of approximately 2-500 psi onto the joint contact areas. In some embodiments the contact pressure may be in the range of 2-40 psi. In some embodiments, minimal pressure may be used. The contact pressure used at this step is significantly lower than that seen in the joining step using hot pressing/sintering as seen in prior processes, which may use pressures in the range of 2000-3000 psi. In an exemplary embodiment, the plates are pressed together with approximately 2 psi of contact pressure and joined at 850 C under vacuum with a pressure lower than 1×10 E-4 Torr. In some embodiments, the plates are joined at a temperature of greater than 770 C. In some aspects, the plates are joined at a temperature in the range of 770 C to 1200 C.

After brazing, the two circular plates will have a circular disc of aluminum between them which join them with a hermetic seal. An exclusion pattern may be machined into the aluminum layer by machining through one of the plates and then through the Al layer. In some aspects, the machining is done using ultrasonic milling and continues into the other plate approximately 0.001 inches. In some aspects, the machining is done through the bottom ceramic layer, and then also through the joining layer.

The exclusion pattern in the aluminum layer is mirrored with a void in the plate through which the machining was carried out. The void is then filled with a filler, such as a high dielectric effect epoxy. In some aspects, the filler may be magnesium oxide and then covered with glass such as fiberglass. In some aspects, the voids are filled with solid pieces of dielectric material, which may be bonded in with a high dielectric effect epoxy.

The back filled plate may then be planarized so that the surface through which the filler was placed can be made flat. After the filling of the voids, the plate through which the machining was not done, which may become a top plate, may be machined down to a thinner thickness. For example, the top plate may be machined down to the range of 0.010 to 0.012 inches, or other thinner thickness. In some aspects, the top plate may be thinned down to a thickness of 0.006 inches. With the placement of the filler material underneath the top layer in the exclusion zones of the electrode pattern, there is support for the top layer as the machining thins down the top plate.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A method for manufacturing an electrostatic chuck, said method comprising:
joining a first ceramic plate to a second ceramic plate using a metal joining layer, machining an exclusion pattern in the metal joining layer through voids in said first ceramic plate; and filling the voids with a dielectric filler material without the dielectric filler material entering into the exclusion pattern.

2. The method of claim 1 wherein said metal joining layer comprises aluminum of greater than 99% by weight.

3. The method of claim 1 wherein the step of joining a first ceramic plate to a second ceramic plate comprises the steps of:
depositing a layer of aluminum onto a joining surface of said first ceramic plate; placing a joining surface of said first ceramic piece onto a joining surface of said second ceramic piece with said layer of aluminum between said first ceramic piece and said second ceramic piece; heating said first ceramic plate to said second at a temperature of greater than 770 C while at a pressure lower than 1×10 $E^{-4}$ Torr.

4. The method of claim 3 wherein said second ceramic piece comprises a ceramic from the group of alumina, aluminum oxide, beryllia, and zirconia.

5. The method of claim 2 wherein said first ceramic piece comprises a ceramic from the group of alumina, aluminum oxide, beryllia, and zirconia.

6. The method of claim 5 wherein said second ceramic piece comprises a ceramic from the group of alumina, aluminum oxide, beryllia, and zirconia.

7. The method of claim 6 wherein said second ceramic piece comprises a ceramic from the group of alumina, aluminum oxide, beryllia, and zirconia.

8. The method of claim 1 wherein the step of filling the voids comprises filling the voids with a dielectric effect epoxy.

9. The method of claim 1 wherein the step of machining an exclusion pattern comprises machining an exclusion pattern which comprises a plurality of isolated electrode portions.

10. The method of claim 4 wherein the step of machining an exclusion pattern comprises machining an exclusion pattern which comprises a plurality of isolated electrode portions.

11. The method of claim 8 wherein the step of machining an exclusion pattern comprises machining an exclusion pattern which comprises a plurality of isolated electrode portions.

12. The method of claim 1 wherein the step of machining an exclusion pattern comprises machining an exclusion pattern which comprises a circumferential ring within the outer periphery of said first ceramic piece and said second ceramic piece.

13. The method of claim 8 wherein the step of machining an exclusion pattern comprises machining an exclusion pattern which comprises a circumferential ring within the outer periphery of said first ceramic piece and said second ceramic piece.

14. The method of claim 11 wherein the step of machining an exclusion pattern comprises machining an exclusion pattern which comprises a circumferential ring within the outer periphery of said first ceramic piece and said second ceramic piece.

\* \* \* \* \*